United States Patent
Behfar et al.

(10) Patent No.: US 6,326,285 B1
(45) Date of Patent: Dec. 4, 2001

(54) SIMULTANEOUS MULTIPLE SILICON ON INSULATOR (SOI) WAFER PRODUCTION

(75) Inventors: Alex A. Behfar, Poughquag; Kris V. Srikrishnan, Wappingers Falls, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/511,165

(22) Filed: Feb. 24, 2000

(51) Int. Cl.$^7$ ...................................................... H01L 21/30
(52) U.S. Cl. ......................... 438/455; 438/458; 438/406
(58) Field of Search .................................... 438/455, 458, 438/406, 407, 528, 977

(56) References Cited

U.S. PATENT DOCUMENTS

| | | |
|---|---|---|
| 5,366,923 | * 11/1994 | Beyer et al. . |
| 5,374,564 | 12/1994 | Bruel . |
| 5,714,395 | 2/1998 | Bruel . |
| 5,882,987 | 3/1999 | Srikrishnan . |
| 5,899,712 | 5/1999 | Choi et al. . |
| 5,915,193 | 6/1999 | Tong et al. . |
| 6,251,754 | * 6/2001 | Ohshima et al. . |

FOREIGN PATENT DOCUMENTS

| | | |
|---|---|---|
| 97400151 | 1/1997 | (EP) . |
| 98307095 | 9/1998 | (EP) . |

* cited by examiner

*Primary Examiner*—Tuan H. Nguyen
(74) *Attorney, Agent, or Firm*—McGuireWoods, LLP; Jay H. Anderson

(57) ABSTRACT

A method of forming multiple SOI wafers from a plurality of individual wafers each having a first side and a second side. The method includes forming an oxide surface on the first side on each of the plurality of individual wafers and forming a hydrogen rich region at a preselected depth on the second side on each of the plurality of individual wafers. The wafers are then bonded into a stacked configuration and heat treated to fracture the wafers at the hydrogen rich regions. This fracture forms at least two SOI wafers.

53 Claims, 9 Drawing Sheets

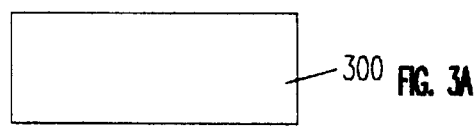
FIG. 3A
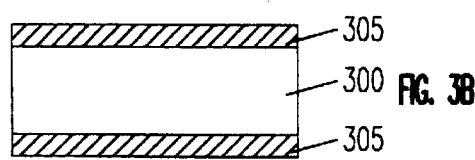
FIG. 3B
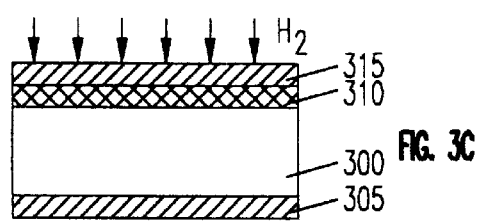
FIG. 3C
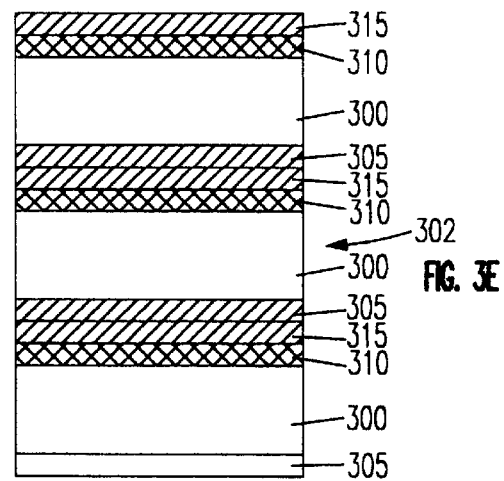
FIG. 3E
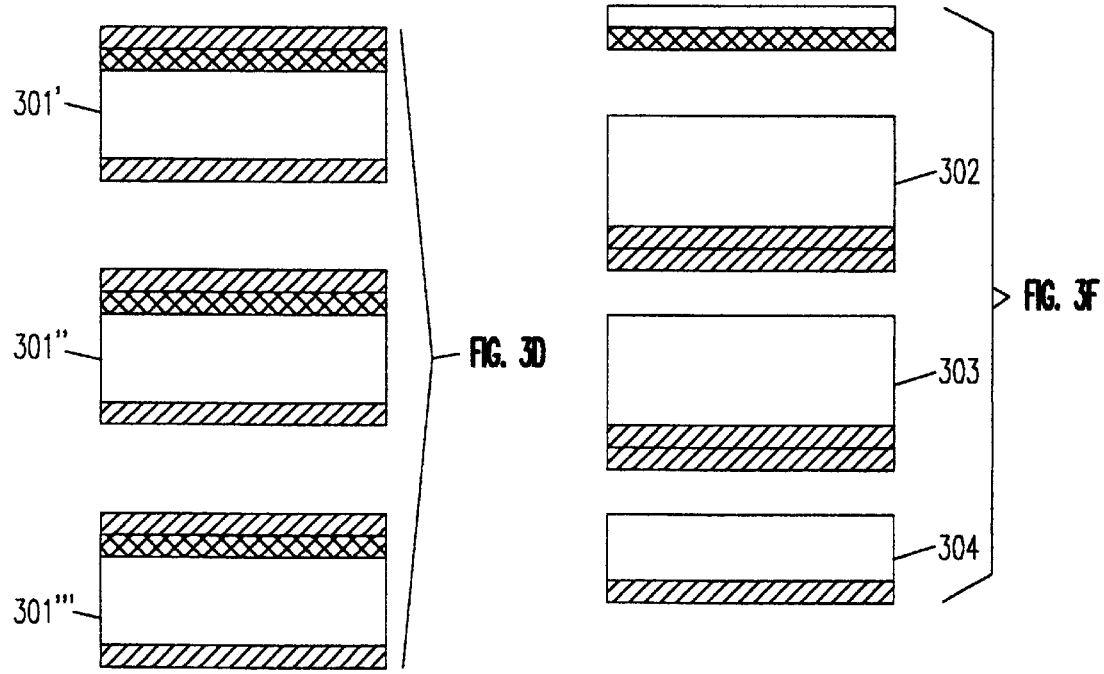
FIG. 3D
FIG. 3F

SIMULTANEOUS MULTIPLE SILICON ON INSULATOR (SOI) WAFER PRODUCTION

BACKGROUND OF THE INVENTION

1. Field of the Invention

The present invention generally relates to silicon on insulator (SOI) wafer production and, more particularly, to the simultaneous production of multiple SOI wafers.

2. Background Description

Silicon on insulator (SOI) wafers are typically used in special applications such as, for example, static random access memories (SRAMs), and more recently for high performance complementary metal oxide semiconductor (CMOS) and dynamic random access memory (DRAM) applications. FIG. 1 shows a conventional SOI wafer cross section having an insulating layer 15 formed on a substrate 10 and a device layer 20 formed on the insulating layer 15.

The SOI wafers are typically manufactured by one of two processes. For example, the SOI wafers can be manufactured by (i) implanted oxygen (SIMOX) in which oxygen is implanted into silicon and converted into a silicon dioxide ($SiO_2$) buried layer or (ii) wafer bonding and etch-back (BESOI) in which two wafers are bonded with oxide surface layers and one wafer is thinned to leave a thin device layer. In some versions of BESOI processing, etch stop layers are used in conjunction with chemical mechanical-polishing (CMP) to improve thickness and uniformity control. The BESOI process is costly and complex since it uses two wafers (a device quality wafer and a supporting wafer) for each resulting SOI wafer, and the additional process of etching back the supporting wafer (which does not form any part of the final product) when manufacturing the SOI wafer.

Another recent process for producing SOI substrates is the Smart-Cut™ process as described in U.S. Pat. No. 5,374,564, which is incorporated by reference in its entirety into the present application. The Smart-Cut™ process uses a hydrogen layer that is implanted prior to bonding, and an annealing process to fracture the bulk silicon after bonding to leave behind a thin layer. CMP is used to planarize and minimize non-uniformity of the cut SOI wafer.

More specifically and as described in U.S. Pat. No. 5,374,564, the Smart-Cut™ process includes processing a device wafer to have a quality surface layer. An oxide layer is provided over the device layer, and a buried hydrogen-rich layer is implanted at a certain depth. A "handle wafer" with or without an oxide surface is provided, and the device wafer is flipped and the surfaces are bonded. The structure is annealed to form connecting voids from hydride formation. The structure is then fractured, and the transferred device layer is CMP polished and cleaned.

Although the art of producing SOI wafers is well developed, there remain some problems inherent in this technology. One particular problem is that it is difficult to provide thickness uniformity across the device layer of the wafer. Another problem inherent in this technology is the need for two wafers (e.g., a supporting wafer and a device quality wafer) when forming a single SOI wafer. This latter problem greatly increases the cost and complexity of manufacturing SOI wafers.

The lack of thickness uniformity is mainly due to the need for polishing, such as CMP, to smooth the surface of the device layer. To overcome this problem, U.S. Pat. No. 5,882,987 incorporated herein in its entirety into the present application has devised a method for forming a thin device layer. This is accomplished by providing an etch stop layer beneath the device layer in the starting substrate. The etch stop layer eliminates the need for CMP such that the device thickness, uniformity and smoothness are based on the deposited film and not on the CMP.

More specifically, FIGS. 5A–5G of U.S. Pat. No. 5,882,987 show the formation of an etch stop layer on a first wafer and an epitaxial device layer formed on the etch stop layer. A bonding layer is formed on the device layer. Ions are implanted into the first wafer in order to form a buried layer, and a second wafer is bonded to the bonding layer. The bonded first and second layers are heated and separated so that the second wafer has a top surface layer comprising Si from the first wafer. The top surface and the etch layer are then removed such that the epitaxial device layer remains on the second wafer to form the thin semiconductor layer.

Even though the process of using an etch stop can be effectively used to form thin device layers, it still remains a problem in the art of SOI technology to process non-SIMOX process SOI wafers without the need of an additional non-device quality supporting structure wafer. To further complicate matters, not only does the use of two wafers increase the costs of production but the additional steps of either etching or otherwise discarding the non-device quality wafer also adds to the costs and complexities of manufacturing the SOI wafers. The severe cost problems and process complexities associated with the production of SOI wafers can clearly be seen from the description of U.S. Pat. No. 5,882,987 and as well as in the Smart-Cut™ method of processing SOI wafers.

Thus, there is a need for a process that is capable of producing multiple SOI wafers in a single processing step without the need for additional non-device quality wafers. This process would preferably use only one wafer for each manufactured SOI wafer, and would greatly reduce the processing complexities and costs of manufacturing multiple SOI wafers in a single processing step.

SUMMARY OF THE INVENTION

The present invention is directed to a method of forming multiple SOI wafers. The SOI wafers are formed from a plurality of individual wafers each having a first side and a second side. The method includes forming an oxide surface on the first side on each of the plurality of individual wafers and forming a hydrogen rich region at a preselected depth on the second side on each of the plurality of individual wafers. The latter step defines a device region above the hydrogen rich region on a second side and a mechanical region between the hydrogen rich region and the first side on each of the plurality of individual wafers.

The wafers are then bonded into a stacked configuration having at least a top wafer, a middle wafer and a bottom wafer. In an embodiment, the first side of the middle wafer is bonded to the device region of the bottom wafer and the second side of the middle wafer is bonded to the first side of the top wafer. An annealing process is then performed on the stacked configuration so as to fracture the top wafer, the middle wafer and the bottom wafer at the hydrogen rich regions. This fracture forms a first and a second SOI wafer. The first SOI wafer includes the device region of the middle wafer and the mechanical region of the top wafer, and the second SOI wafer includes the device region of the bottom wafer and the mechanical region of the middle wafer.

It can be appreciated by those skilled in the art in view of the teachings of the present invention that more than two SOI wafers may be formed by the process of the present invention. For example, three SOI wafers will be formed when starting with four wafers and using the above-process of the present invention.

In a second embodiment, an oxide surface is formed on the first side on each of the plurality of individual wafers and an etch stop is formed on the second side of each of the plurality of individual wafers. A device layer is then formed on the etch stop layer and a hydrogen rich region is formed at a preselected depth on the second side on each of the plurality of individual wafers below the etch stop layer and the device layer. This process defines a mechanical region between the hydrogen rich region and the first side on each of the plurality of individual wafers.

Thereafter, the plurality of wafers are bonded to form a stacked configuration having at least a top wafer, a middle wafer and a bottom wafer. In this configuration, the oxide surface of the middle wafer is bonded to the device layer of the bottom wafer and the device layer of the middle wafer is bonded to the oxide surface of the top wafer. The stacked configuration is then annealed so that the top wafer, the middle wafer and the bottom wafer fracture at the respective hydrogen rich regions. This fracturing then forms two SOI wafers. The first SOI wafer includes the device layer of the middle wafer and the mechanical region of the top wafer, and the second SOI wafer includes the device layer of the bottom wafer and the mechanical region of the middle wafer. The two SOI wafers then may be selectively etched, and the etch stop thereafter removed. More than two SOI wafers may be formed by the process of the present invention.

In an alternative embodiment, the etch stop layer may be used as the device layer. In this case, no device layer is formed above the etch stop layer. All other steps remain the same as described above.

In still another embodiment, a highly stressed layer is used as the etch stop layer. When hydrogen is implanted adjacent and below the etch stop layer, on heating, the hydrogen can either form hydride or diffuse to the etch stop layer and weaken the interface to the extent, that the stressed layer can start a fracture. This process is called hydrogen assisted fracture. It is understood that a stack of wafers using the principle can be formed by the simultaneous SOI formation method.

In yet another embodiment, the hydrogen assisted cracking along with a stressed etch stop layer is performed by initiating the cracking along the perimeter of the wafer only. This can lead to the initiation of the fracture at the perimeter, which is propagated into the interior region along the highly stressed etch stop layer. The advantage of this embodiment is that the hydrogen implantation can be limited to a finite perimeter region, for example to a width of 10 mm or less. The crack initiation is either achieved by hydride formation or by hydrogen assisted cracking.

In all the above embodiments, a bonding layer is formed optionally on the first side above the device region or layer to improve the bonding process.

BRIEF DESCRIPTION OF THE DRAWINGS

The foregoing and other objects, aspects and advantages will be better understood from the following detailed description of a preferred embodiment of the invention with reference to the drawings, in which:

FIGS. 3a–3f show a side view of an SOI wafer fabricated in accordance with the process of FIG. 2;

DETAILED DESCRIPTION OF A PREFERRED EMBODIMENT OF THE INVENTION

In order to accomplish the objectives of the present invention, several wafers having an oxide layer on a bottom side and a hydrogen rich layer on an opposing side are bonded to one another in a stacked configuration. In the preferred embodiment, there are at least three such wafers bonded together. After the wafers are bonded together in a stacked configuration, an annealing process is performed and the SOI wafers are broken apart at the hydrogen rich region such that the device layer of one wafer and the mechanical region of an adjacent wafer form a plurality of SOI wafers simultaneously. These SOI wafers do not have a supporting wafer, unlike the wafers used in conventional processes. In embodiments, the SOI wafers may be selectively wet etched and the etch stop thereafter removed from the device.

Method and Apparatus of the First Embodiment of the Present Invention

Figure 1:
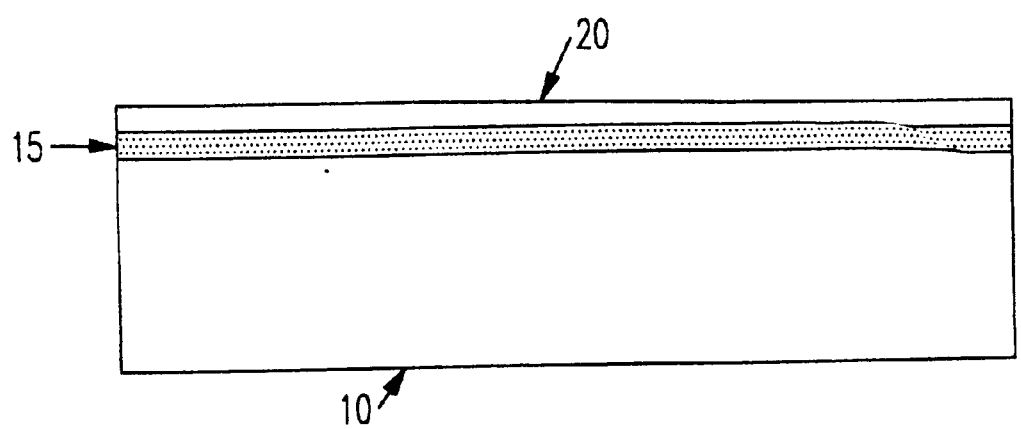
FIG. 1 shows a side view of a conventional SOI wafer.
Figure 2:
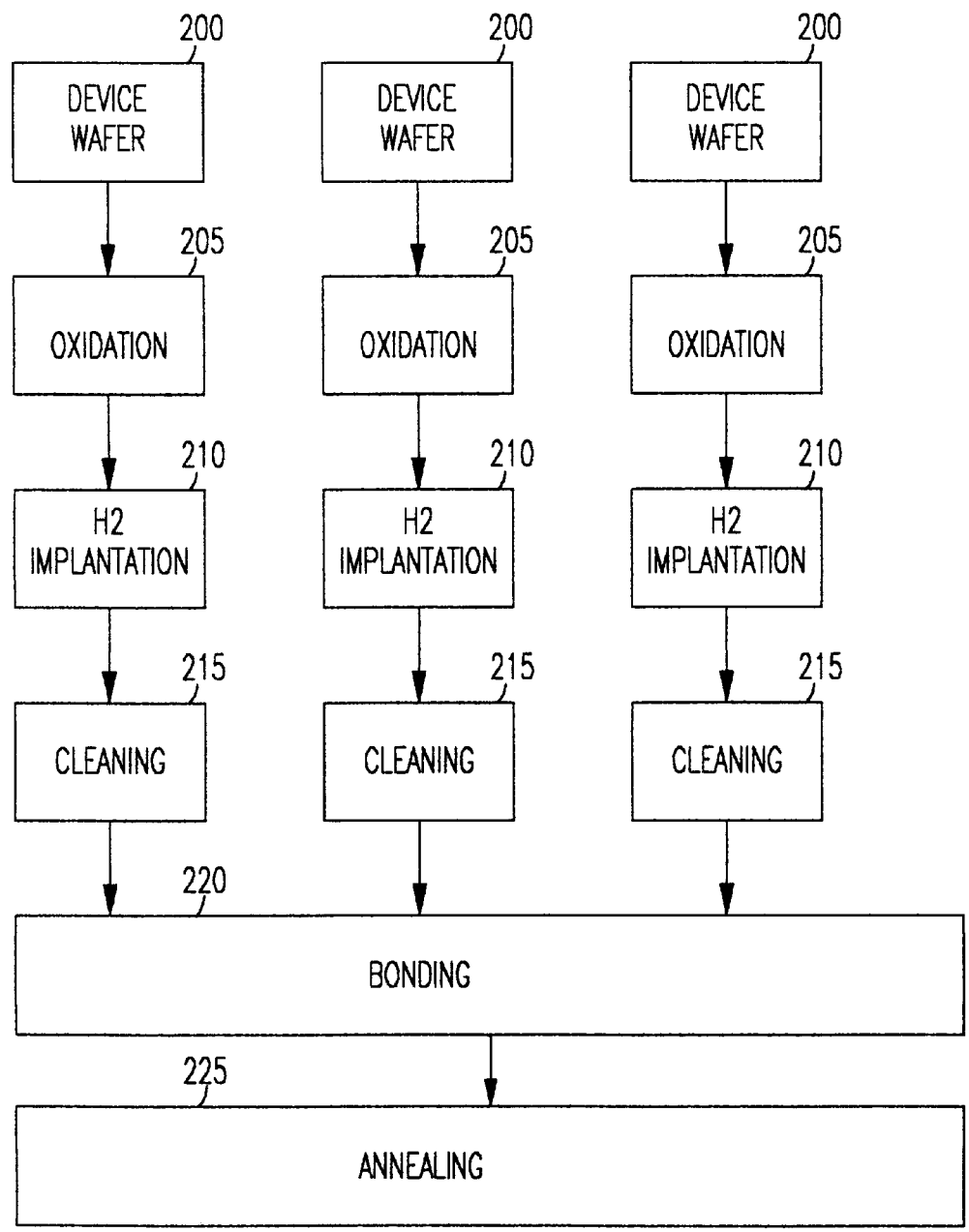
FIG. 2 shows a process flow of an exemplary fabrication process in accordance with an embodiment of the present invention.

Referring now to the drawings, and more particularly to FIG. 2, there is shown a flow diagram of one exemplary embodiment of a fabrication process in accordance with the present invention. Specifically, in process step 200, a single crystalline semiconductor wafer substrate is provided. In process step 205, an oxide layer (about 100 Å to 10,000 Å in thickness) is provided on the single crystalline semiconductor wafer substrate, which in the preferred embodiment is thermally grown on surfaces of the single crystalline semiconductor wafer substrate. However, deposited oxides or inorganic insulators can also be used with the present invention. In process step 210, hydrogen ions are implanted into the second surface of the single crystalline semiconductor wafer substrate using a dosage of preferably $10^{16}$ to $2 \times 10^{17}$ ions/cm$^2$ at an implantation energy of 50 to 150 KeV. (Different dosages may be used with different sized substrates.) The hydrogen implantation forms a hydrogen-rich layer at a depth of preferably $4 \times 10^{-5}$ to $8 \times 10^{-5}$ inch (1 to 2 $\mu$m) from the top surface of the oxide layer on the second surface. Because both the thickness of the device layer and the surface oxide layer are known, the proper implantation voltage can be selected so as to have the peak of the implanted hydrogen occur at the desired depth. A higher implantation voltage will result in greater depth where the hydrogen peak region is formed. The implantation can be across the entire surface or a portion of the surface, such as an outer ring or segment at or near the periphery of the wafer.

In process step 215, the fabricated wafer device is cleaned using conventional wet processes, such as an RCA cleaning process. Cleaning removes surface impurities and particles from the surfaces layers. Steps 200–215 are then repeated so as to form at least three wafers.

In process step 220, the at least three wafers are then bonded to one another in preferably a cylindrical stacked configuration. In this bonding configuration, the oxide layer on the first side of an upper wafer is bonded to the oxide layer on the second side of a lower wafer. The bonding process is preferably a hydrophilic bonding process performed at room temperature by (i) cleaning the exposed surfaces, (ii) wetting the surfaces, (iii) contacting the surfaces with each other, and (iv) compressing the surfaces so as to form one structure.

In process step 225, the bonded wafers are then annealed by heating to a temperature between about 400° and 600° C., with the temperature preferably being about 500° C., for about 30 to 120 minutes. The annealing process causes hydrogen reaction with the substrate locally which lead to separation, such as a fracture or cleaving, within the bonded wafers at the position of the hydrogen rich regions. This results in at least two separate SOI wafer structures. (See FIG. 3f.) The SOI wafers are subjected to a high temperature anneal (approximately between 1000° and 1400° C.) to improve oxide bonding (step 230), followed by smoothing the fractured device layer roughness by standard polishing techniques.

Referring now to 3a–3f, the corresponding cross-sections of selected steps from the process flow diagram of FIG. 2 are now described. In FIG. 3a, a single crystalline semiconductor wafer substrate 300 is provided. Unlike prior art wafers, the single crystalline semiconductor wafer substrate 300 should be device quality since it will be part of the final SOI structure. An oxide (bonding) layer 305 is then formed on at least on one of the first and second surfaces of the single crystalline semiconductor wafer substrate 300. The oxidation layer 305 is preferably thermally grown on the single crystalline semiconductor wafer substrate 300 (FIG. 3b), but high quality deposited oxides (similar to thermal oxide) can also be used with the present invention. In the preferred embodiment, the oxide layer (bonding layer) is formed on both surfaces. However, it is also possible to bond a device layer to the bonding layer with good bonding strength. In this case, the high temperature anneal would improve the oxide to device layer bonding. In FIG. 3c, hydrogen ions are implanted at 50 to 150 KeV (step 210 of FIG. 2) to form a hydrogen-rich layer 310 about 0.5 to 2 $\mu$m below the top of the second surface of the single crystalline semiconductor wafer substrate 300.

FIG. 3d shows several of the fabricated wafer devices 301. In FIG. 3e, the fabricated wafer devices 301 are bonded together such that the oxide layer 305 at the first surface of the wafer 301 is bonded to the oxide layer 305 at the second surface of wafer 301'. Similarly, the oxide layer 305 at the first surface of the wafer 301' is bonded to the oxide layer 305 at the second surface of the wafer 301", etc. As discussed with reference to process step 220 of FIG. 2, the bonding process is preferably a hydrophilic bonding process performed at room temperature. It is well understood by one of ordinary skill in the art that three or more wafers 301 may be stacked and bonded to each other in accordance with the present invention.

As shown in FIG. 3f, once the anneal process is performed, the wafer stack 302 is fractured thereby forming simultaneously multiple SOI wafer devices 303 of the present invention, containing device layer 315. As an end product, a single wafer 304 will not be used and thus discarded. It is noted, however, that by using the method of the present invention, excluding the end discarded wafer only one wafer 300 is needed for every separate SOI wafer formed; whereas, two wafers for every SOI wafer formed are needed in prior art processes.

Method and Apparatus of the Second Embodiment of the Present Invention

Figure 4:
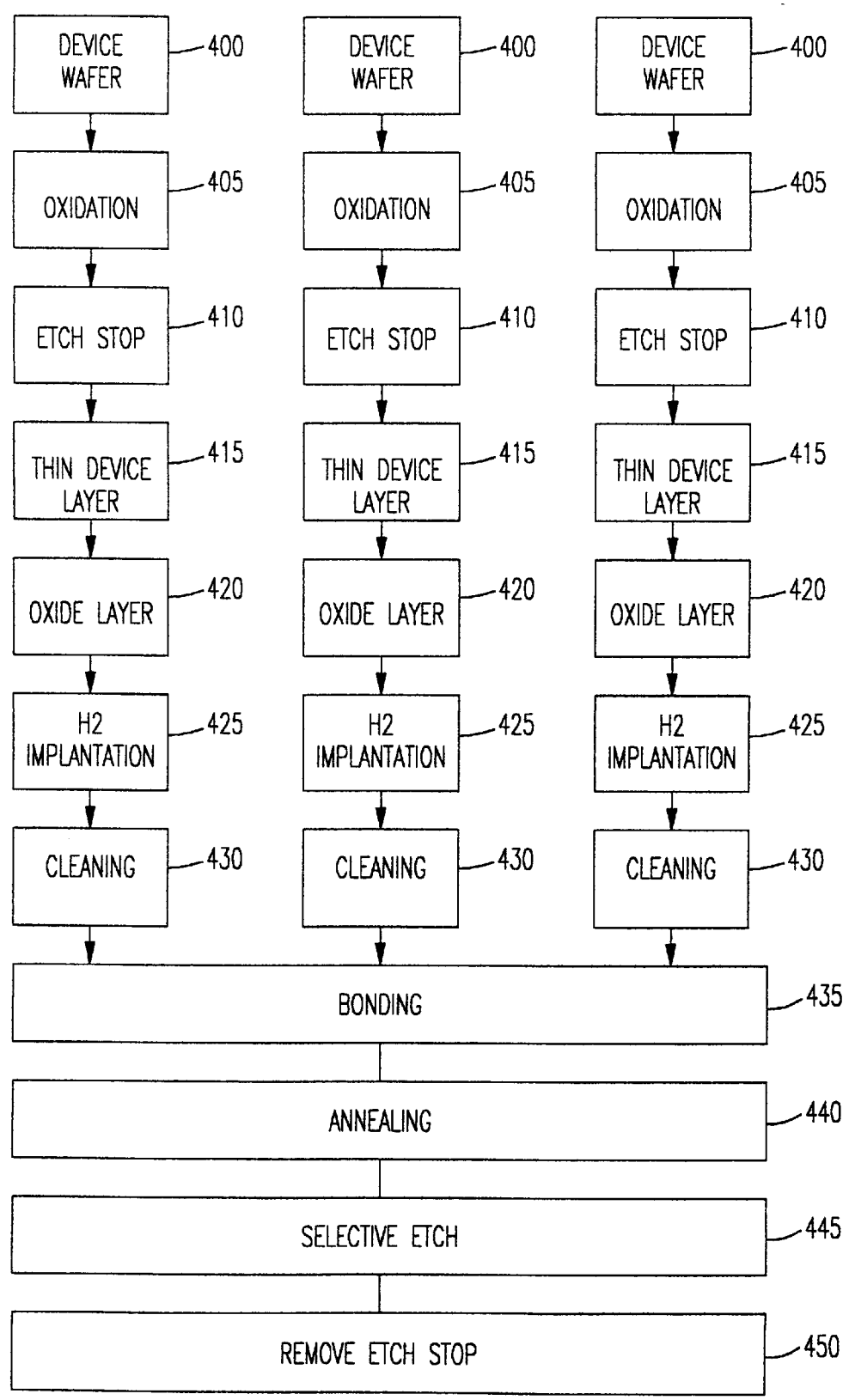
FIG. 4 shows a process flow of an exemplary fabrication process in accordance with another embodiment of the present invention.

FIG. 4 shows a process flow of an exemplary fabrication process in accordance with another embodiment of the present invention. Specifically, in process step 400, a single crystalline semiconductor wafer substrate is provided. In process step 405, an oxide layer is provided on the single crystalline semiconductor wafer substrate. As with the embodiment of FIG. 2, the single crystalline semiconductor wafer substrate should be of device quality. The oxide layer, however, should be preferably deposited on the first surface of the single crystalline semiconductor wafer substrate. As an alternative, thermally grown oxide on both the first and second surfaces followed by removal of the oxide from the second surface may also be used in the present invention.

In process step 410, a thin etch stop layer having a predetermined composition and thickness is epitaxially grown/deposited on the second surface of the wafer. The etch stop layer has a preferred thickness in the range of about $3.9 \times 10^{-7}$ to $7.8 \times 10^{-5}$ inch (100 to 2000 Å), and preferably with a thickness of about $9.8 \times 10^{-7}$ inch (250 Å). The etch stop material is preferably chosen so that it is selective in its etch behavior as compared to the substrate wafer material. For example, a high doped (p+or n+) silicon layer, a silicon-germanium (Si—Ge) layer, a strained Si—Ge layer, or a Ge layer can be used as an etch stop layer. However, in the most preferred embodiments, the etch stop layer is a high doped Ge compensated layer of Si—Ge preferably deposited using a chemical vapor deposition (CVD) process. A strained Si—Ge layer if used may assist the separation process, but is not required. The dopant concentration in the case of a silicon etch stop layer is preferably in the range between $10^{20}$ and $10^{21}$ atoms/cm$^3$ of boron.

Figure 5A:
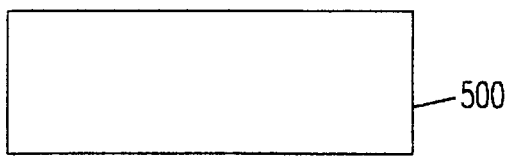
FIGS. 5a–5i show a side view of a SOI wafer fabricated in accordance with the process of FIG. 4.
Figure 5B:
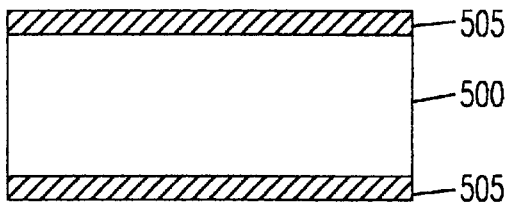
Figure 5C:
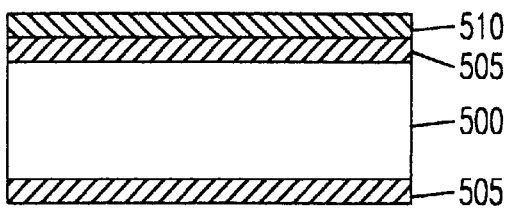
Figure 5D:
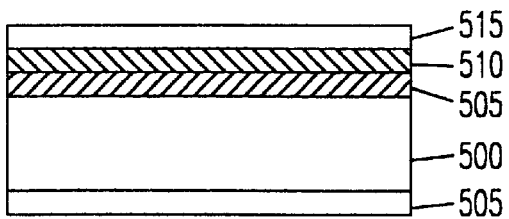

In process step 415, a thin device layer having a selected thickness and dopant concentration is then epitaxially deposited over the etch stop layer (see FIG. 5d). The choice of etch stop layer should take into account strain mismatch between the etch stop layer and the device layer so that a good quality low dislocation device layer can be deposited. The device layer can be Si, Si—Ge, Ge, or any other compound semiconductor. In cases where the device layer is the same as the etch stop layer (Ge, Si—Ge), there is no need to form a separate device layer 415.

In process step 420, part of the device layer is optionally converted thermally to an oxide layer. In this manner, the device layer has a corresponding reduction in its thickness. Alternatively, a variety of CVD and physical deposition processes are available for deposition of silicon dioxide as the bonding layer. In-situ conversion of the device layer to oxide by thermal oxidation can be performed by furnace oxidation or rapid thermal oxidation.

In process step 425, hydrogen ions are implanted into the second surface of the single crystalline semiconductor wafer substrate using a dosage of preferably $10^{16}$ to $2 \times 10^{17}$ ions/cm$^2$ at an implantation energy of 50 to 150 KeV. Thereafter, the fabricated wafer device should be cleaned in process step 430. The hydrogen implant and cleaning processes are similar to the respective processes of FIG. 2. Steps 400–430 are then repeated so as to form at least three fabricated device wafers.

In process step 435, the at least three fabricated device wafers are then bonded to one another in preferably a cylindrical stacked configuration. Much like the embodiment of FIG. 2, the oxide layer of the first surface of an upper fabricated device wafer is bonded to the oxide layer/device layer of the second surface of a lower fabricated device wafer. The bonding process is preferably a hydrophilic bonding process (as discussed with reference to FIG. 2).

In process step 440, the bonded fabricated device wafers are then annealed by heating to a temperature at about between about 300° and 600° C., with the temperature preferably being about 500° C., for about 30 to 120 minutes. As previously discussed, the annealing causes hydrogen substrate interaction (e.g. hydride phase formation) which lead to a separation, such as a fracture or cleaving of the bonded wafers, at the position of the hydrogen rich regions. This results in at least two separate SOI wafers. (See FIG. 5I.) The SOI wafers are subjected to a high temperature anneal to improve the oxide bonding. In some cases, hydrogen can weaken the etch stop layer to the device silicon to cause hydrogen assisted breakage.

In process step 445, a selective wet etch is performed to remove a thin top surface layer of the SOI wafer structures. The etching is stopped by etch stop layer. The remaining etch stop layer is removed in process step 450 by preferably a selective wet or dry etch (since the thickness is so small, a selectivity of as low as 2× would be sufficient).

FIGS. 5a–5i show a side view of a wafer fabricated in accordance with the process of FIG. 4. In FIG. 5a, a single crystalline semiconductor wafer substrate 500 is provided. Much like the wafer shown in FIGS. 3a–3f, the single crystalline semiconductor wafer substrate 500 should be device quality since it will be part of the final SOI structure. An oxide layer 505 is then formed on the single crystalline semiconductor wafer substrate 500. If the oxide is formed on both sides, the oxide from the second side is removed.

In FIG. 5c, an etch stop layer 510 is epitaxially deposited on the upper surface (second side) of the wafer 500. As discussed with reference to the flow process of FIG. 4, the etch stop layer 510 should preferably be a highly doped Ge compensated layer of Si—Ge with dopant in the range between $10^{20}$ and $10^{21}$ atoms/cm$^3$ of boron.

Figure 5E:
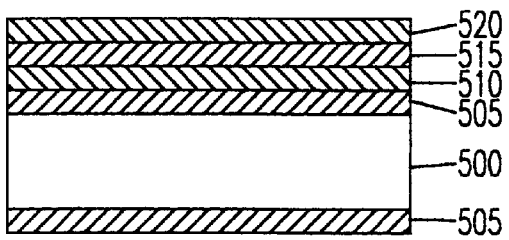
Figure 5F:
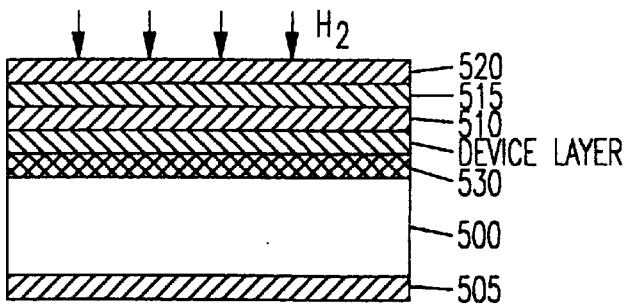

FIG. 5d shows a device layer 515 epitaxially deposited on the etch stop layer 510. The device layer 510 can be Si, Si—Ge, Ge, or any other compound semiconductor such as SiC, GaAs, etc. In some cases, the device layer can also act as an etch stop layer and vice versa. In these instances, a single layer is sufficient. Si—Ge layers used in this application may contain 5 to 30 atomic percent Ge. The thickness of the device layer 510 is preferably about $3.9 \times 10^{-6}$ inch (1000 Å) and can range from about $2 \times 10^{-6}$ to $2 \times 10^{-5}$ inch (500 to 5000 Å). FIG. 5e shows an oxide layer 520 converted from the device layer 515. Alternatively, a thin bonding layer can be deposited. Hydrogen ions are implanted at 50 to 150 KeV to form a hydrogen-rich layer 530 about 0.5 to 2 $\mu$m below the second surface of the single crystalline semiconductor wafer substrate 500.

Figure 5G:
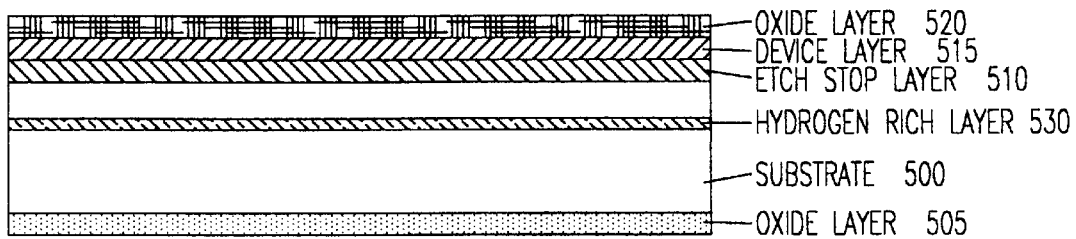
Figure 5G:
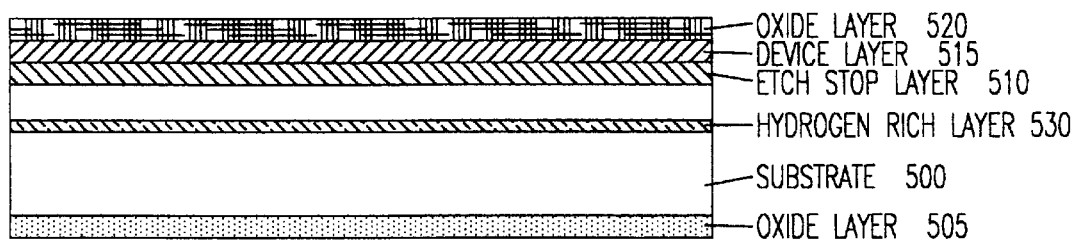
Figure 5G:
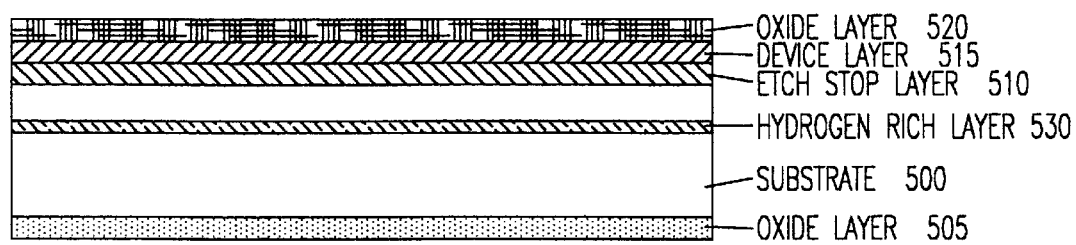
Figure 5G:
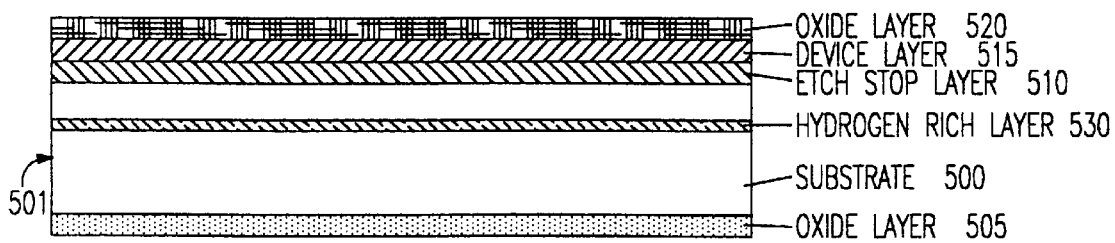
Figure 5H:
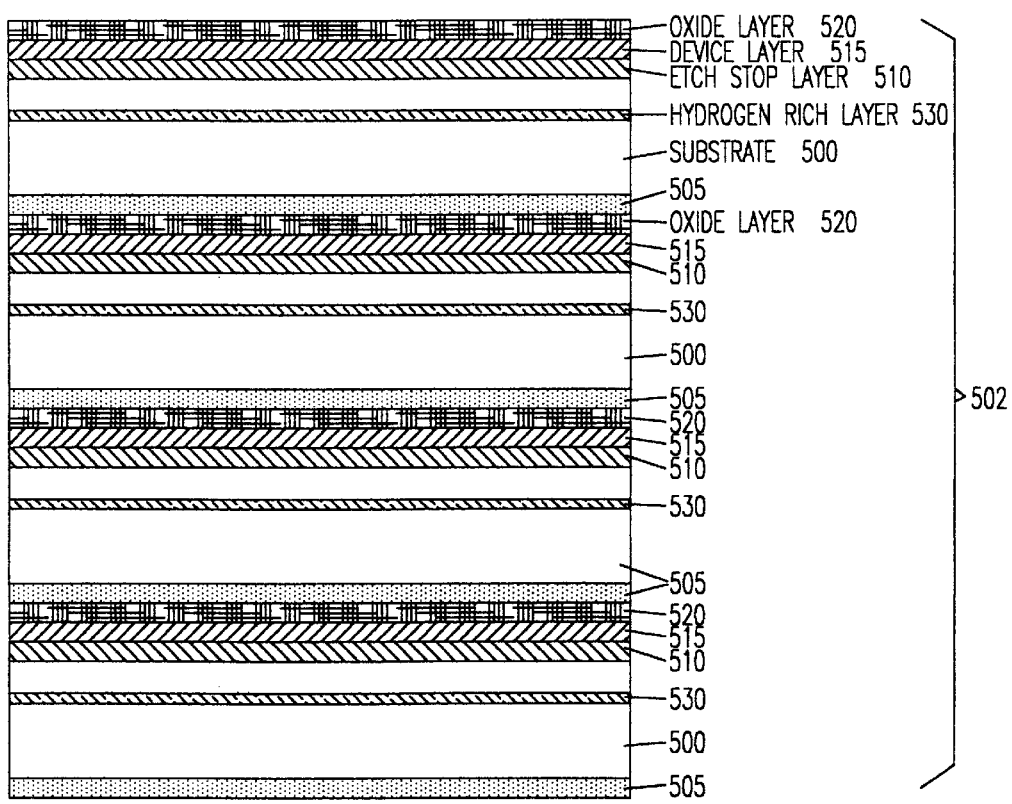

FIG. 5g shows several of the processed wafers 501. In FIG. 5h, the fabricated wafers 501 are bonded together such that the oxide layer 505 of wafer 501 is bonded to the oxide layer 520 of wafer 501'. Similarly, the oxide layer 505 of 501' is bonded to the oxide layer 520 of wafer 501", etc. As discussed with reference to process step 220 of FIG. 2 and the process step 435 of FIG. 4, the bonding process is preferably a hydrophilic bonding process performed at room temperature. It is well understood by one of ordinary skill in the art that three or more processed wafers 501 may be stacked and bonded to each other in accordance with the present invention.

Figure 5I:
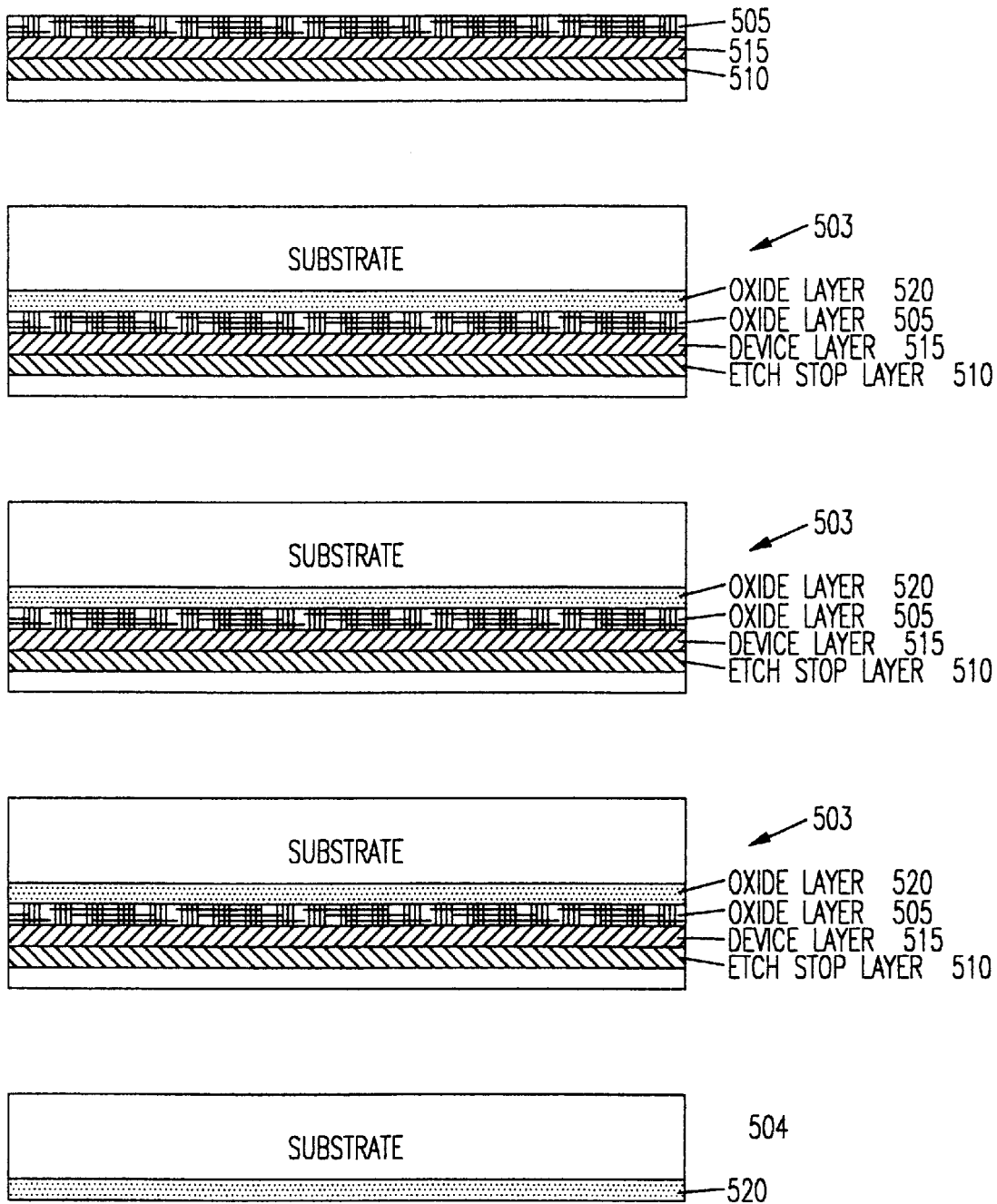

As shown in FIG. 5i, once the anneal process is performed, the wafer stack 502 is fractured thereby forming multiple SOI wafers 503 of the present invention. The SOI wafers are subjected to a high temperature anneal to improve oxide 505 to oxide 520 bonding. As an end product, a single wafer substrate 504 will be not be used and is thus discarded. However, similar to the embodiment of FIG. 2, by using the method of the present invention only one wafer substrate 500 is needed for every separate SOI wafer formed (not including the end wafer); whereas, two wafers for every SOI wafer formed are used in prior art systems.

In embodiments, a selective wet etch is performed on the SOI wafers to remove a thin top surface layer 570. The topography or roughness and non-uniformity of the remaining device layer 515 is reduced significantly depending on the etch selectivity. A modest selectivity of 10× will reduce the roughness and non-uniformity by 10×. For example, a roughness of $7.8 \times 10^{-7}$ to $2 \times 10^{-6}$ inch (200 to 300 Å) will be reduced to below $7.8 \times 10^{-8}$ inch (20 Å). Caustic etch solutions such as potassium hydroxide (KOH) or ammonium hydroxide etch low doped silicon at a rate of 100:1 or greater with respect to high doped Si or Si—Ge (i.e., the etch selectivity is >100:1 for etching low doped substrate: etch stop layer 510). The remaining etch stop layer is then removed by a wet or dry etch. In cases where a single layer (optionally) serves as both the etch stop and the device layer there is no need to remove this layer.

The resulting device layer has a smoothness substantially equal to that of the as-deposited device layer 515 and does not require touch up. Because the etch stop layer 510 and device layer 515 are deposited layers, they have very good uniformity and thickness control across the wafer substrate, which are preserved by this exemplary process. Also, by using the method of the present invention there is no need to have a polishing operation since the thickness of the device layer is precisely controlled by the deposition uniformity of the device layer and the etch stop layer.

In an alternative embodiment as described with reference to FIGS. 5a–5i, the etch stop layer itself is intended to be used as the device layer. In this case, the device layer deposition is avoided and the bonding layer is formed directly on top of the etch stop/device layer. The hydrogen implantation steps are followed as described above. After fracture, the fractured silicon is removed up to the etch stop layer and a resulting SOI wafer with the device layer formed of the etch stop layer is achieved. A suitable etch stop layer that can also be a good device layer can be selected from the group of materials such as Si—Ge, SiC, Ge and any of the compound Semiconductors.

Method and Apparatus of the Additional Embodiments of the Present Invention

Figure 6:
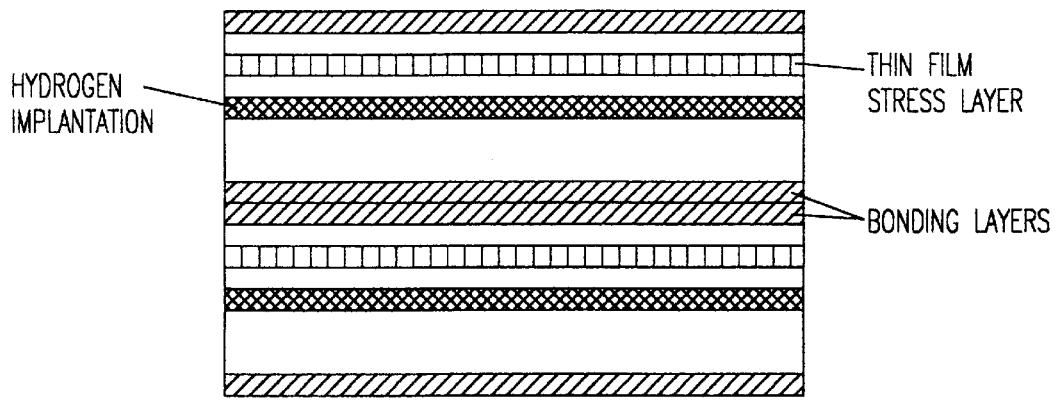
FIG. 6 illustrates the concept of hydrogen assisted, stressed etch stop layer fracturing.

In the embodiment shown in FIG. 6, a highly stressed film is used as the etch stop layer. For example, films such a Ge, Ga—As and Si—Ge having high Ge content, because of their mismatch to Si, will have very e film stress in the area of $10^{10}$–$10^{11}$ dynes/cm$^2$, which makes them at the verge of self-peeling. When hydrogen is implanted and after joining the two or more wafers, a heat treatment of 300–500° C. causes the hydrogen migration and reaction at the stressed film location and in combination with the stressed film to form a fracture along the stressed film. This is along the concepts known as hydrogen embrittlement of metals, where stressed areas (due to notches or holes) undergo further weakening in the presence of hydrogen, leading to propagation of fracture. The thickness of the high intrinsic stress film can be in the range of 250 Å to 5000 Å. FIG. 6 shows the case of two wafers joined with a highly stressed layer, which starts fracturing when the critical stress exceeds its fracture strength. Under some conditions, external mechanical assistance such as cleaving using a blade or compressed air or water knifes can be used to assist the fracture to propagate.

Figure 7:
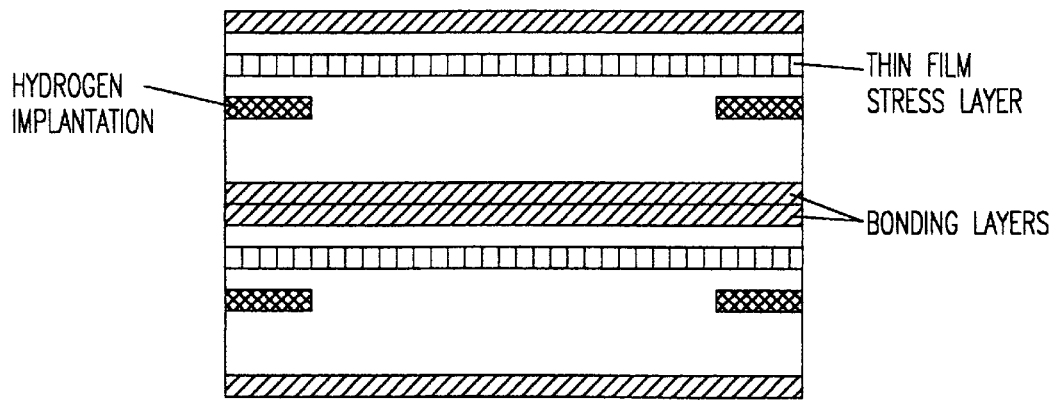
FIG. 7 illustrates the concept of crack initiation at the perimeter, with the crack propagation into the wafer along the etch stop layer.

In still another embodiment shown in FIG. 7, the brittle nature of the silicon substrate is utilized. The crack formed is localized to the edge by selectively implanting the hydrogen to the perimeter region and when the fracture starts at the perimeter, it is easily propagated into the interior along the etch stop plane by thermal stresses and or by external assistance through mechanical forces such by use of a blade or compressed liquid along the fractured perimeter region. It is also possible to use the perimeter implantation as shown in FIG. 6 where it is combined with a high intrinsic stress film layer to start the fracturing process at the perimeter.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A method of forming multiple SOI wafers, the method comprising:
   forming an oxide surface on a first side of each of a plurality of individual wafers;
   forming a hydrogen rich region at a preselected depth on a second side of each of the plurality of individual wafers, thereby defining a device region above the hydrogen rich region and defining a mechanical region between the hydrogen rich region and the first side on each of the plurality of individual wafers;
   bonding the plurality of wafers to form a stacked configuration having at least a top wafer, a middle wafer and a bottom wafer, wherein the first side of the middle wafer is bonded to the second side of the bottom wafer and the second side of the middle wafer is bonded to the first side of the top wafer; and
   heat treating the stacked configuration so as to separate the top wafer, the middle wafer and the bottom wafer at the hydrogen rich region of the top wafer, the middle wafer and the bottom wafer thereby forming at least two SOI wafers, wherein
      a first SOI wafer includes the device region from the middle wafer and the mechanical region from the top wafer, and
      a second SOI wafer includes the device region from the bottom wafer and the mechanical region from the middle wafer.

2. The method of claim 1, wherein the bonding step comprises:
   wetting the first side of the middle wafer, the second side of the middle wafer, the second side of the bottom wafer and the first side of the top wafer
   contacting the first side of the middle wafer to the second side of the bottom wafer and the second side of the middle wafer to the first side of the top wafer; and
   compressing the top wafer, the middle wafer and the bottom wafer.

3. The method of claim 2, wherein the bonding step is performed at room temperature.

4. The method of claim 3, wherein the annealing is performed at a temperature of 450° C. for approximately between 30 to 120 minutes.

5. The method of claim 1, wherein the forming a hydrogen rich layer if formed by implanting hydrogen ions at a dosage of approximately $10^{16}$ to $2\times10^{17}$ ions/cm$^2$ at an implantation energy of 50 to 150 KeV on the second side of each of the plurality of individual wafers.

6. The method of claim 5, wherein the hydrogen rich layer is formed approximately 1 to 2 $\mu$m below the second side on each of the plurality of individual wafers.

7. The method of claim 1, further comprising cleaning the first side of the middle wafer, the second side of the middle wafer, the second side of the bottom wafer and the first side of the top wafer.

8. The method of claim 1, wherein the individual wafers are annealed at a high temperature of approximately between 1000° and 1400° Celsius.

9. The method of claim 8, wherein the second side is smoothed by polishing.

10. The method of claim 1, wherein the hydrogen rich region is formed only on a portion of the second side of each of the plurality of individual wafers.

11. The method of claim 10, wherein the portion is a ring near or at the periphery of the wafer.

12. The method of claim 1, wherein the separation at the hydrogen rich region is a fracture.

13. The method of claim 1, wherein the separation at the hydrogen rich region is through cleaving.

14. The method of claim 1, wherein the heat treating is an annealing performed at a temperature between about 300° and 600° C.

15. A method of forming multiple SOI wafers, the method comprising:
   forming an oxide surface on a first side of each of a plurality of individual wafers;
   forming an etch stop layer on a second side of each of the plurality of individual wafers;
   forming a device layer on the etch stop layer on each of the plurality of individual wafers;
   forming a hydrogen rich region at a preselected depth on the second side on each of the plurality of individual wafers below the etch stop layer and the device layer, thereby defining a mechanical region between the hydrogen rich region and the first side on each of the plurality of individual wafers;
   bonding the plurality of wafers to form a stacked configuration having at least a top wafer, a middle wafer and a bottom wafer, wherein the oxide surface of the middle wafer is bonded to the device layer of the bottom wafer and the device layer of the middle wafer is bonded to the oxide surface of the top wafer; and
   heat treating the stacked configuration so as to fracture the top wafer, the middle wafer and the bottom wafer at the hydrogen rich region of the top wafer, the middle wafer and the bottom wafer thereby forming two SOI wafers, wherein
      a first SOI wafer includes the device layer of the middle wafer and the mechanical region of the top wafer, and
      a second SOI wafer includes the device layer of the bottom wafer and the mechanical region of the middle wafer.

16. The method of claim 15, further comprising forming an oxide layer on the device layer on each of the plurality of individual wafers.

17. The method of claim 16, wherein the bonding step includes bonding the oxide surface of the middle wafer to the oxide layer of the bottom wafer and the oxide layer of the middle wafer is bonded to the oxide surface of the top wafer.

18. The method of claim 15, wherein the forming the hydrogen rich region includes implanting hydrogen ions into each of the plurality of wafers using a dosage of $10^{16}$ to $2\times10^{17}$ ions/cm$^2$ at an implantation energy of 50 to 150 KeV.

19. The method of claim 15, wherein the stacked configuration is a cylindrical stacked configuration.

20. The method of claim 15, wherein the bonding step includes:
   wetting the oxide surface of the middle wafer, the device region of the middle wafer, the device region of the bottom wafer and the oxide surface of the top wafer;

contacting the oxide surface of the middle wafer to the device region of the bottom wafer and the device region of the middle wafer to the oxide surface of the top wafer; and compressing the top wafer, the middle wafer and the bottom wafer.

21. The method of claim 15, wherein the annealing is performed at a temperature of 450° C.

22. The method of claim 15, wherein the annealing is performed at a temperature between 300° and 600° C.

23. The method of claim 15, further comprising selectively wet etching a top surface of the first SOI wafer and the second SOI wafer.

24. The method of claim 15, further comprising removing the etch stop layer on the first SOI wafer and the second SOI wafer.

25. The method of claim 15, wherein the etch stop layer is formed at a thickness in the range of about $3.9 \times 10^{-7}$ to $7.8 \times 10^{-5}$ inch (100 to 2000 Å).

26. The method of claim 15, wherein the etch stop layer is formed at a thickness of about $9.8 \times 10^{-7}$ inch (250 Å).

27. The method of claim 15, wherein the oxide surface is deposited.

28. The method of claim 15, wherein the oxide surface is thermally grown.

29. The method of claim 15, wherein the device layer is comprised of at least one selected from a group consisting of a highly doped Si layer, a Si—Ge layer, Ge layer, SiC layer and GaAs layer.

30. The method of claim 29, wherein the Ge in Si—Ge is 5 to 30 atomic percent.

31. The method of claim 15, wherein the hydrogen rich region is formed only on a portion of the second side of each of the plurality of individual wafers.

32. The method of claim 31, wherein the portion is a ring near or at the periphery of the wafer.

33. The method of claim 15, wherein the separation at the hydrogen rich region is a fracture.

34. The method of claim 15, wherein the separation at the hydrogen rich region is through cleaving.

35. A method of forming multiple SOI wafers, the method comprising:

forming an oxide surface on a first side of each of a plurality of individual wafers;

forming a device layer on a second side of each of the plurality of individual wafers, the device layer being selectively etchable to silicon;

forming a hydrogen rich region at a preselected depth on the second side on each of the plurality of individual wafers below the device layer, thereby defining a mechanical region between the hydrogen rich region and the first side on each of the plurality of individual wafers;

bonding the plurality of wafers to form a stacked configuration having at least a top wafer, a middle wafer and a bottom wafer, wherein the oxide surface of the middle wafer is bonded to the device layer of the bottom wafer and the device layer of the middle wafer is bonded to the oxide surface of the top wafer; and heat treating the stacked configuration so as to fracture the top wafer, the middle wafer and the bottom wafer at the hydrogen rich region of the top wafer, the middle wafer and the bottom wafer thereby forming two SOI wafers, wherein a first SOI wafer includes the device layer of the middle wafer and the mechanical region of the top wafer, and a second SOI wafer includes the device layer of the bottom wafer and the mechanical region of the middle wafer.

36. The method of claim 35, further comprising forming an etch stop layer on the second side of each of the plurality of individual wafers, wherein the device layer is formed on the etch stop layer.

37. The method of claim 35, wherein the device layer is an etch stop.

38. The method of claim 35, wherein the device layer is comprised of at least one selected from a group consisting of a highly doped Si layer, a Si—Ge layer, Ge layer, SiC layer and GaAs layer.

39. The method of claim 38, wherein the Ge in the Si—Ge layer is 5 to 30 atomic percent.

40. A method of forming multiple SOI wafers, the method comprising:

forming an oxide surface on a first side of each of a plurality of individual wafers;

forming a high intrinsic stress thin film layer on a second side of each of the plurality of individual wafers;

forming a device layer on the oxide surface on each of the plurality of individual wafers;

forming a hydrogen rich region at a preselected depth on the second side on each of the plurality of individual wafers below the high intrinsic stress thin film layer and the device layer, thereby defining a mechanical region between the hydrogen rich region and the first side on each of the plurality of individual wafers;

bonding the plurality of wafers to form a stacked configuration having at least a top wafer, a middle wafer and a bottom wafer, wherein the oxide surface of the middle wafer is bonded to the device layer of the bottom wafer and the device layer of the middle wafer is bonded to the oxide surface of the top wafer; and heat treating the stacked configuration so as to fracture the top wafer, the middle wafer and the bottom wafer near the high intrinsic stress thin film layer of the top wafer, the middle wafer and the bottom wafer thereby forming two SOI wafers, wherein a first SOI wafer includes the device layer of the middle wafer and the mechanical region of the top wafer, and a second SOI wafer includes the device layer of the bottom wafer and the mechanical region of the middle wafer.

41. The method of claim 40, further comprising forming an oxide layer on the device layer on each of the plurality of individual wafers.

42. The method of claim 40, wherein the bonding step includes bonding the oxide surface of the middle wafer to an oxide layer of the bottom wafer and the oxide surface of the middle wafer is bonded to an oxide layer of the top wafer.

43. The method of claim 40, wherein the forming the hydrogen rich region includes implanting hydrogen ions into each of the plurality of wafers using a dosage of about $10^{16}$ at an implantation energy of 50 to 150 KeV.

44. The method of claim 40, wherein the stacked configuration is a cylindrical stacked configuration.

45. The method of claim 40, wherein the bonding step includes:

wetting the oxide surface of the middle wafer, the device region of the middle wafer, the device region of the bottom wafer and the oxide surface of the top wafer;

contacting the oxide surface of the middle wafer to the device region of the bottom wafer and the device region of the middle wafer to the oxide surface of the top wafer; and compressing the top wafer, the middle wafer and the bottom wafer.

46. The method of claim 40, wherein the heat treating is performed at a temperature of 450° C.

47. The method of claim 40, wherein the heat treating is performed at a temperature between 300° and 600° C.

48. The method of claim 40, wherein the hydrogen rich region is formed only on a portion of the second side of each of the plurality of individual wafers.

49. The method of claim 40, wherein the portion is a ring near or at the periphery of each of the plurality of individual wafers.

50. The method of claim 40, wherein the fracturing is assisted by mechanical means.

51. The method of claim 40, wherein the high intrinsic stress thin film layer is selected from a group consisting of Ge, Si—Ge and Ga—As.

52. The method of claim 40 wherein the high intrinsic stress thin film layer has a tensile stress exceeding $10^{10}$ dynes/cm$^2$.

53. The method of claim 40, wherein the high intrinsic stress thin film layer has a thickness in the range 250–5000 Å.

* * * * *